(12) United States Patent
Tang et al.

(10) Patent No.: US 10,803,974 B1
(45) Date of Patent: Oct. 13, 2020

(54) MEMORY DEVICE PROVIDING BAD COLUMN REPAIR AND METHOD OF OPERATING SAME

(71) Applicant: Yangtze Memory Technologies Co., Ltd., Wuhan, Hubei Province (CN)

(72) Inventors: Qiang Tang, Wuhan (CN); Chunyuan Hou, Wuhan (CN); Jiawei Chen, Wuhan (CN)

(73) Assignee: Yangtze Memory Technologies Co., Ltd., Wuhan, Hubei Province (CN)

(*) Notice: Subject to any disclaimer, the term of this patent is extended or adjusted under 35 U.S.C. 154(b) by 0 days.

(21) Appl. No.: 16/589,112

(22) Filed: Sep. 30, 2019

Related U.S. Application Data

(63) Continuation of application No. PCT/CN2019/095768, filed on Jul. 12, 2019.

(51) Int. Cl.
*G11C 29/44* (2006.01)
*G11C 29/00* (2006.01)
*G11C 11/408* (2006.01)
*G11C 29/30* (2006.01)
*G11C 29/18* (2006.01)

(52) U.S. Cl.
CPC .......... *G11C 29/76* (2013.01); *G11C 11/4082* (2013.01); *G11C 29/30* (2013.01); *G11C 29/4401* (2013.01); *G11C 2029/1806* (2013.01)

(58) Field of Classification Search
CPC ................ G11C 29/76; G11C 29/4401; G11C 2029/1806

USPC ......................................................... 365/200
See application file for complete search history.

(56) References Cited

U.S. PATENT DOCUMENTS

| 3,714,637 | A | 1/1973 | Beausoleil |
| 6,967,878 | B2 | 11/2005 | Dono |
| 9,001,601 | B2 * | 4/2015 | Son ...................... G11C 29/808 |
| | | | 365/200 |
| 10,497,460 | B2 * | 12/2019 | Kim .......................... G11C 8/08 |
| 2015/0143188 | A1 | 5/2015 | Huang |
| 2018/0024948 | A1 | 1/2018 | Tsai |
| 2019/0196904 | A1 | 6/2019 | Kim |
| 2019/0205244 | A1 | 7/2019 | Smith |

FOREIGN PATENT DOCUMENTS

| TW | 201407618 A | 2/2014 |
| TW | 201921252 A | 6/2019 |

* cited by examiner

*Primary Examiner* — Son L Mai
(74) *Attorney, Agent, or Firm* — Winston Hsu

(57) ABSTRACT

A memory device includes a memory array, a first buffer, a second buffer, a repair logic circuit and an internal memory. The method of operating the memory device includes: the repair logic circuit receiving a bad column table from the internal memory, the bad column table containing information of a bad column in the memory array; the first buffer receiving first data; the repair logic circuit receiving the first data from the first buffer; and the repair logic circuit mapping the first data onto second data according to the bad column table.

20 Claims, 8 Drawing Sheets

MEMORY DEVICE PROVIDING BAD COLUMN REPAIR AND METHOD OF OPERATING SAME

CROSS REFERENCE TO RELATED APPLICATIONS

This is a continuation of PCT patent application No. PCT/CN2019/095768, filed on 12 Jul. 2019 and included herein by reference in its entirety.

BACKGROUND OF THE INVENTION

1. Field of the Invention

The invention relates to non-volatile memory, and in particular, to a memory device providing bad column repair and a method of operating the same.

2. Description of the Prior Art

Non-volatile memories are widely adopted for data storage in mobile devices and consumer electronics. In practice, various defects in individual cells, a group of cells, a portion of a bit line, or even an entire bit line are present in the non-volatile memories, and consequently the affected portion cannot be reliably used. Columns containing such defects are referred to as bad columns.

In the related art, redundant columns have been incorporated on a sub-plane basis to replace bad columns in the memories, such approaches require additional circuit areas and are inefficient owing to the redundant columns being made available only to the specified sub-plane.

Therefore, it is desirable to provide a memory device having full-plane-based bad column repair and a method of controlling the same, enhancing circuit area efficiency while managing bad columns to provide reliable memory operations.

SUMMARY OF THE INVENTION

In one embodiment, a method of operating a memory device is disclosed. The memory device includes a memory array, a first buffer, a second buffer, a repair logic circuit and an internal memory. The method includes: the repair logic circuit receiving a bad column table from the internal memory, the bad column table containing information of a bad column in the memory array; the first buffer receiving first data; the repair logic circuit receiving the first data from the first buffer; and the repair logic circuit mapping the first data onto second data according to the bad column table.

In another embodiment, a memory device including a first buffer, a second buffer, a memory array, an internal memory and a repair logic circuit is provided. The first buffer is used to receive first data. The second buffer is used to receive second data. The memory array is coupled to one of the first buffer and the second buffer, and includes an array of memory cells. The internal memory is used to store a bad column table containing information of a bad column of the memory array. The repair logic circuit is coupled to the internal memory and between the first buffer and the second buffer, and used to receive the first data from the first buffer, map the first data onto second data according to the bad column table, and transmit the second data to the second buffer.

In yet another embodiment, a memory device including a first buffer, a memory array, an internal memory and a repair logic circuit is provided. The first buffer is used to receive first data. The memory array includes an array of memory cells. The internal memory is used to store a bad column table containing information of a bad column of the memory array. The repair logic circuit is coupled to the internal memory and between the first buffer and the memory array, and used to receive the first data from the first buffer, map the first data to second data according to the bad column table, and transmit the second data to the memory array.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
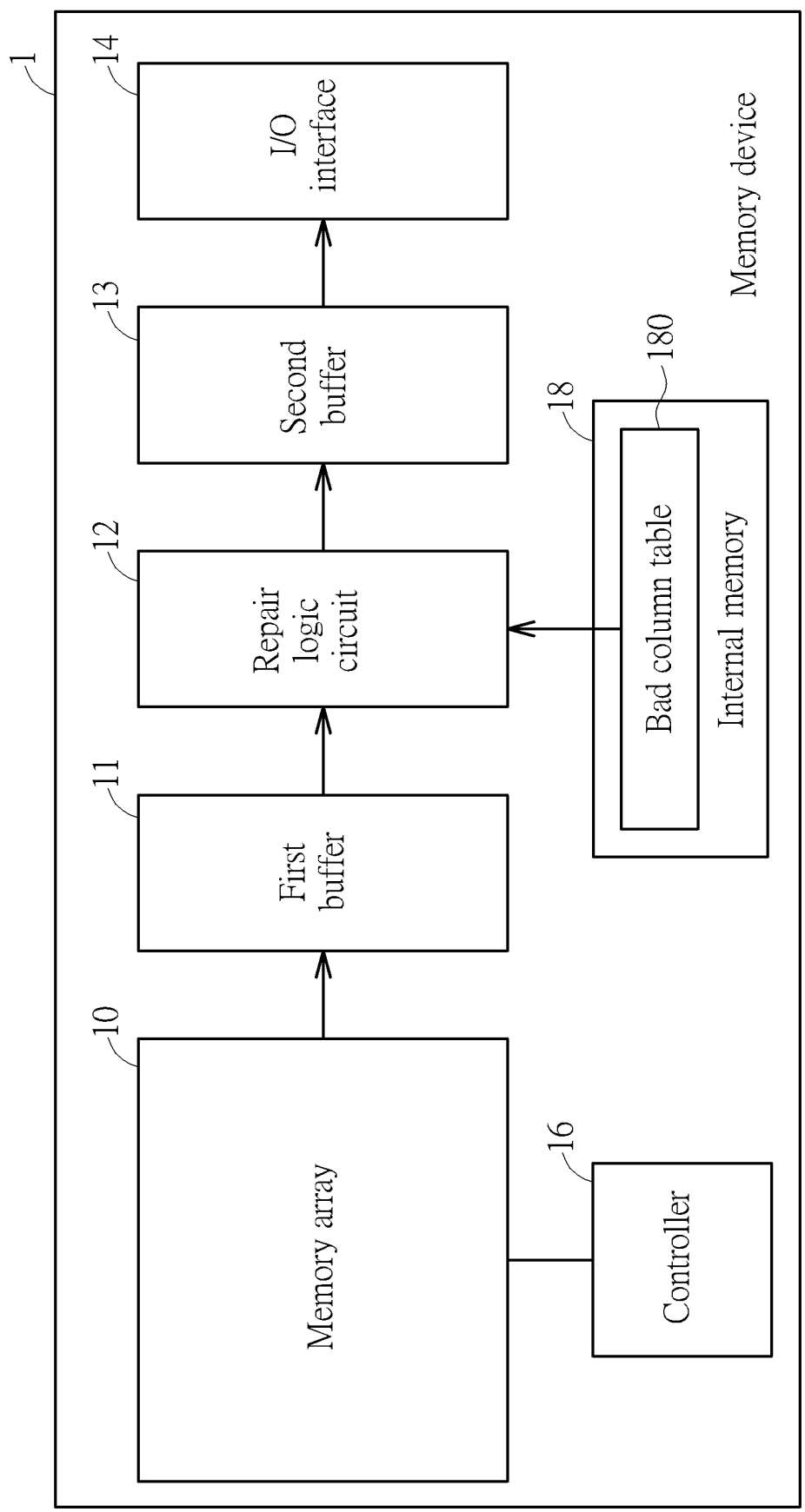
FIG. 1 is a block diagram of a memory device according to an embodiment of the invention.

FIG. 1 is a block diagram of a memory device 1 according to an embodiment of the invention. The memory device 1 may manage bad columns on a full-plane basis, read data from a memory array and remove invalid data therefrom, thereby reducing the circuit area taken up by redundancy columns used in a conventional approach while ensuring proper operations of the memory device 1. The memory device may be a NAND or NOR flash memory device.

The memory device 1 may comprise a memory array 10, a first buffer 11, a repair logic circuit 12, a second buffer 13, an input/output (I/O) interface 14, a controller 16 and an internal memory 18. The controller 16 is coupled to the memory array 10 and may control operations thereof. The memory array 10 is coupled to the first buffer 11. The repair logic circuit 12 is coupled to the internal memory 18, and coupled between the first buffer 11 and the second buffer 13. The second buffer 13 is coupled to the I/O interface 14.

Figure 2:
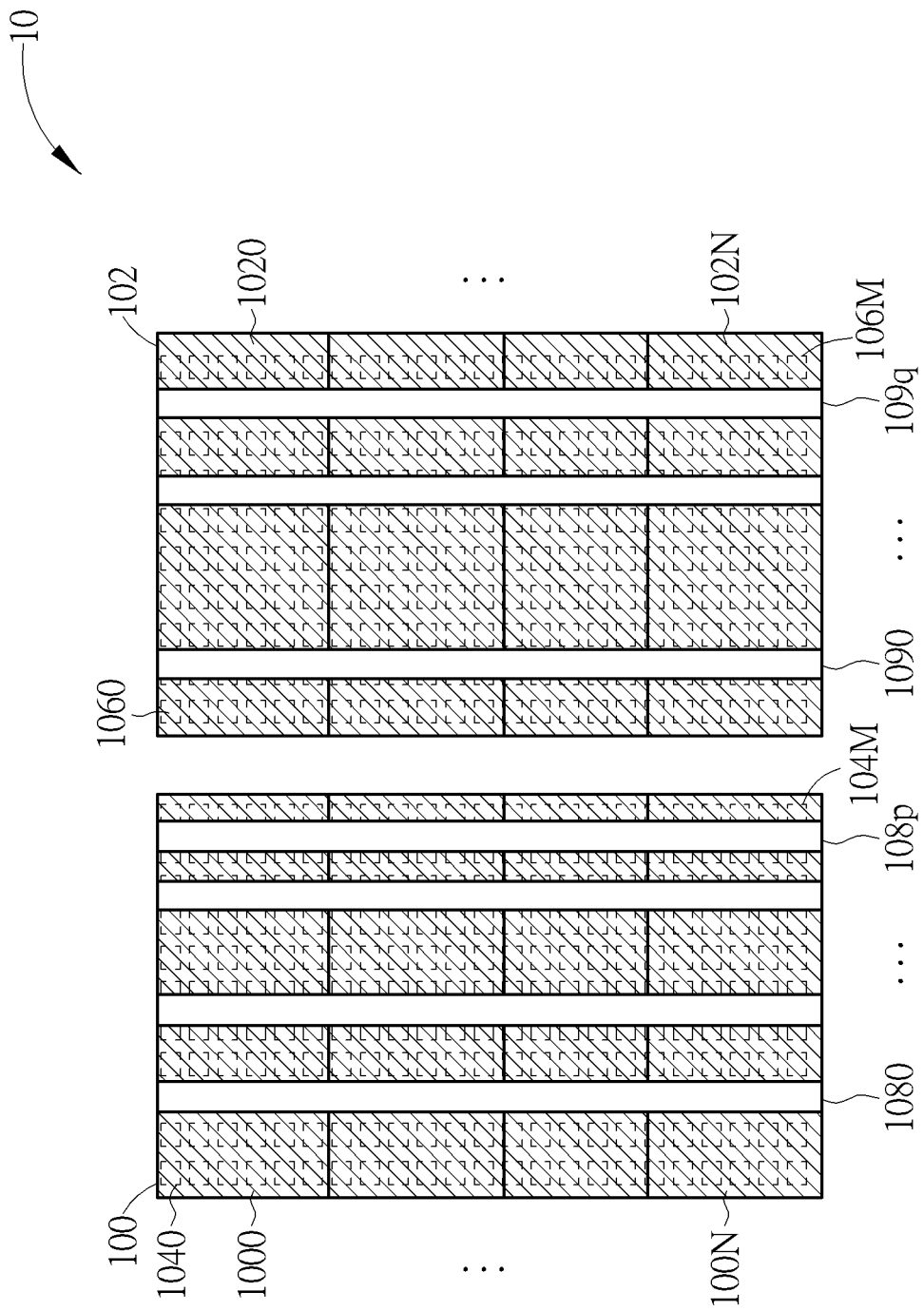
FIG. 2 is an exemplary memory array of the memory device in FIG. 1 containing bad columns.

The I/O interface 14 may interface between the memory device 1 and a host device, receiving a reading command and transmitting user data fetched from the memory array 10 in response thereto. The memory array 10 contains a plurality of non-volatile memory cells arranged into columns and rows, and may contain one or more bad columns including defective memory cells and/or bit lines. FIG. 2 shows an embodiment of the memory array 10 having bad columns 1080 to 108p, 1090 to 109q, p and q being positive integers, e.g., p may be 4 and q may be 3. In the memory array 10, memory cells may be organized into planes 100, 102, blocks 1000 to 100N, 1020 to 102N, and pages 1040 to 104M, 1060 to 106M, N and M being positive integers, e.g., N may be 4096 and M may be 32. Quantities of bad columns may vary from plane to plane. A distribution of bad columns across pages may be unique to each plane, e.g., a distribution of the bad columns 1080 to 108p across the pages 1040 to 104M is unique to the plane 100. The bad columns 1080 to 108p, 1090 to 109q may have a length of 2 bytes or a multiple thereof. Each of bad columns 1080 to 108p, 1090 to 109q may contain invalid data 00, FF or other data patterns.

Returning to FIG. 1, the internal memory 18 may be a read-only memory (ROM) or the header or spare portions of the memory array 10, and may contain a bad column table 180. Information such as column addresses of bad columns in each plane may be identified and recorded in the bad column table 180 during factory testing, thereby mapping out invalid data from the bad columns during reading operations. The column addresses may be recorded in an ascending or descending order. The size of the bad column table 180 may be selected in accordance with a maximum expected quantity of bad columns in each plane. In some embodiments, the bad column table 180 may hold up to 40 bytes of column addresses for 20 bad columns, with each bad column having a column address of 2 bytes in length.

In a reading operation, the controller 16 may address the memory array 10 to output first data to the first buffer 11. The first buffer 11 may have a depth matching the maximum expected quantity of bad columns, e.g., 40 bytes. The repair logic circuit 12 may receive the bad column table 180 from the internal memory 18, receive the first data from the first buffer 11, map the first data onto the second data according to the bad column table 180, and transmit the second data to the second buffer 13. The second buffer 13 may transmit the second data to the host device via the I/O interface 14. The repair logic circuit 12 may perform data mapping on the first data to generate the second data during a pre-fetch period. The data mapping may involve retrieving a logical address carried in the reading command, mapping the logical address onto a physical address of the memory array 10 according to the bad column table 180, and unselecting, from the first data, data not matching the physical address, so as to generate the second data including only valid data. The pre-fetch period is defined as a period from receiving a reading command to producing data for transmission, and may be, for example, 300 ns.

The memory device 1 adopts the first buffer 11, the repair logic circuit 12 and the second buffer 13 to manage bad columns and enhance circuit performance during a reading operation.

Figure 3:
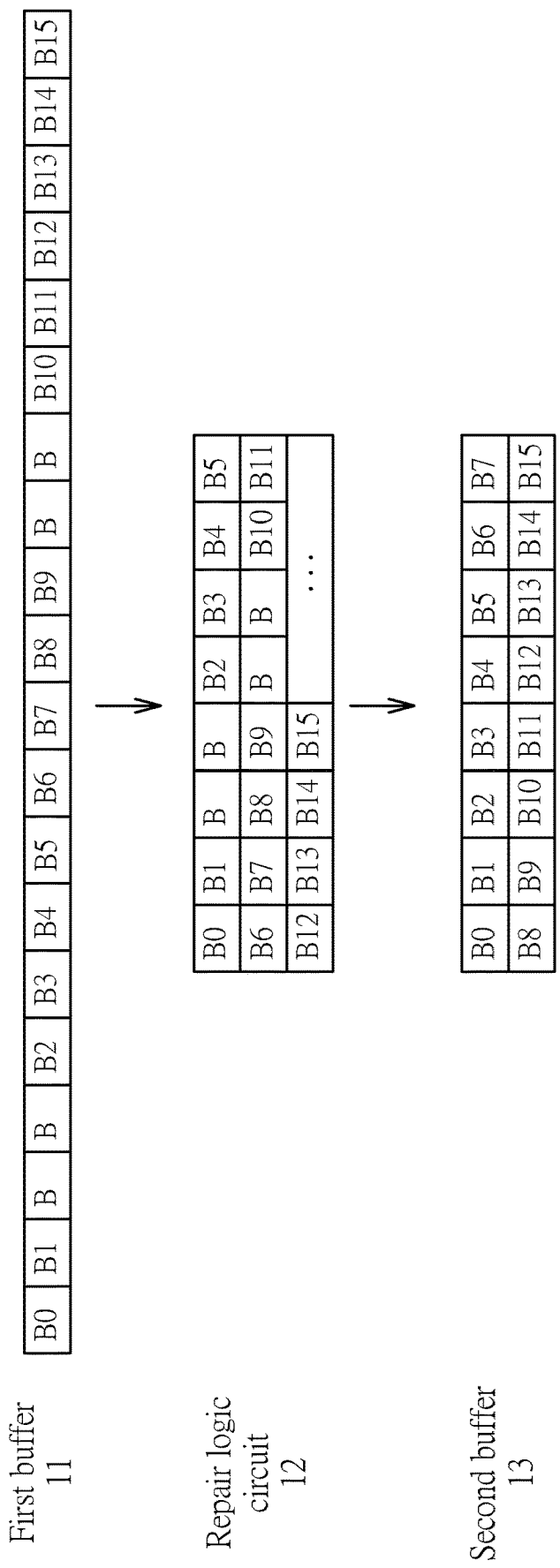
FIG. 3 depicts an exemplary reading operation employing the memory device in FIG. 1.

FIG. 3 depicts an exemplary reading operation employing the memory device 1. The first buffer 11 receives a stream of first data including 2 pieces of invalid data B between bytes B1 and B2 and 2 pieces of invalid data B between bytes B9 and B10. The repair logic circuit 12 identifies locations of the invalid data B in accordance with the bad column addresses in the bad column table 180, removes the 4 pieces of invalid data B from the stream of first data to generate a stream of second data, and output the stream of second data to the second buffer 13, thereby handling data read from the bad columns of the memory array 10.

In the reading operation, the first buffer 11 may receive the first data from the memory array 10 according to a first clock at a first speed. The repair logic circuit 12 may adjust a speed of receiving the first data on the basis of presence of the bad columns, thereby delivering the second data at a fixed speed regardless of the first data being associated with good columns or not. When the bad column table 180 indicates that the first data is associated with the bad column in the memory array 10, the repair logic circuit 12 may receive the first data from the first buffer 11 according to a second clock at a speed exceeding the first speed, e.g., twice the first speed; whereas when the bad column table 180 indicates that the first data is not associated with the bad column in the memory array 10, the repair logic circuit 12 may receive the first data from the first buffer 11 according to the first clock at the first speed. In this fashion, the repair logic circuit 12 may ensure that the second data is transmitted to the second buffer 13 according to the first clock at the first speed even if a portion of the first data, e.g., half of the first data, is read from the bad columns and removed from the first data. The second buffer 13 may transmit the second data to the I/O interface 14 according to a third clock at four times of the first speed, and in turn, the I/O interface 14 may deliver the second data to the host device, completing the reading operation.

Figure 4:
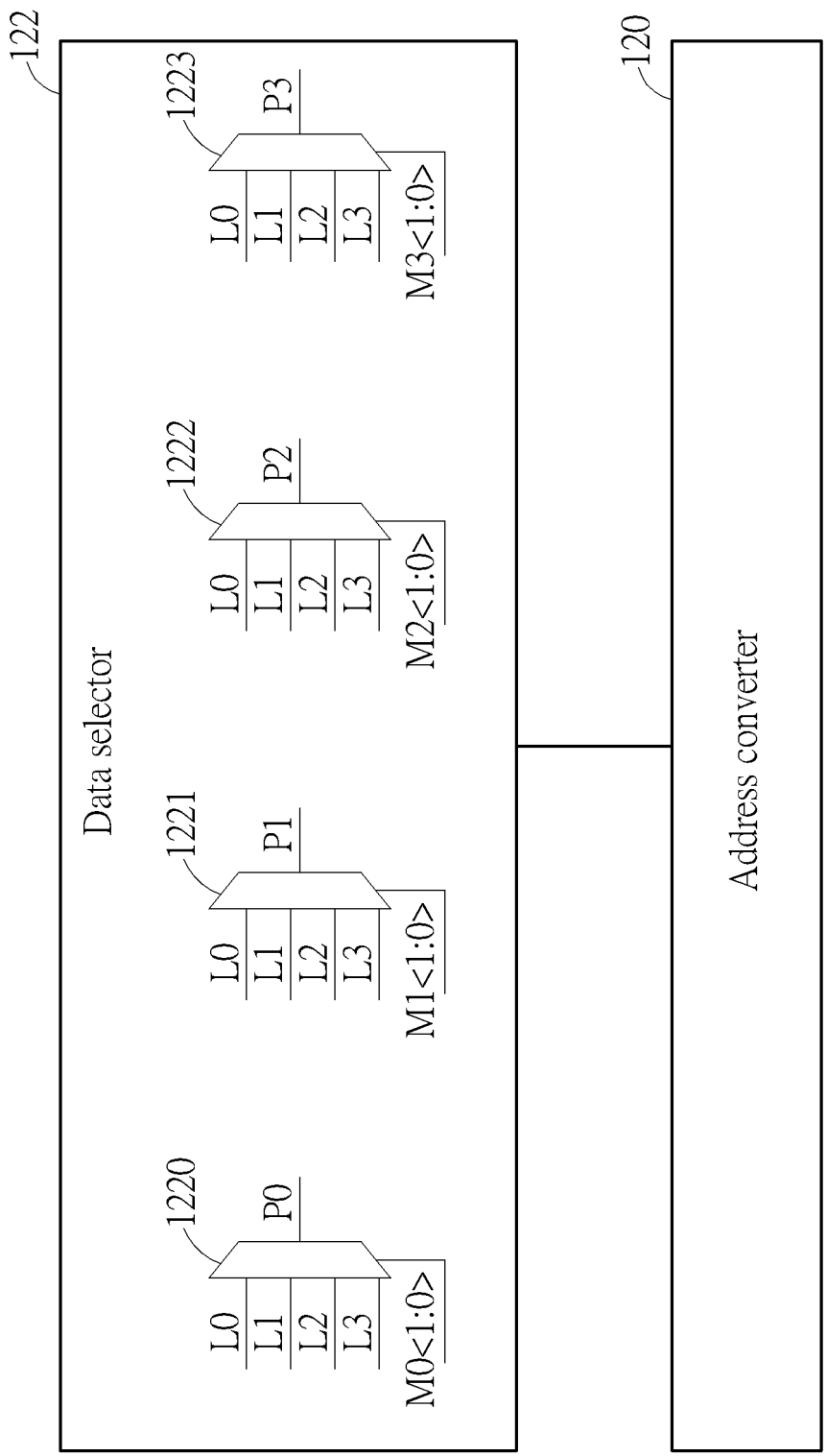
FIG. 4 is a block diagram of the repair logic circuit in the memory device 1.

FIG. 4 is a block diagram of the repair logic circuit 12 in the memory device 1, comprising an address converter 120 and a data selector 122 coupled thereto. The address converter 120 is coupled to the internal memory 18, and the data selector 122 is coupled between the first buffer 11 and the second buffer 13.

The address converter 120 may acquire the bad column table 180 from the internal memory 18 prior to a memory operation, receive a logical address carried in a reading command, and compare the logical address to the bad column addresses to generate selection signals M0<1:0> to M3<1:0> indicating whether to select or unselect a piece of the first data. Operations of the address converter 120 are detailed in FIG. 5.

The data selector 122 may comprise 4-to-1 multiplexers 1220 to 1223, wherein input terminals of the 4-to-1 multiplexers 1220 to 1223 are coupled to the first buffer 11, output terminals of the 4-to-1 multiplexers 1220 to 1223 are coupled to the second buffer 13, and selection terminals of the 4-to-1 multiplexers 1220 to 1223 are coupled to the address converter 120. The input terminals of the 4-to-1 multiplexers 1220 to 1223 may receive respective portions of the first data from the first buffer 11 addressed by input location pointers L0 to L3, the selection terminals of the 4-to-1 multiplexers 1220 to 1223 may receive the respective selection signals M0<1:0> to M3<1:0> indicative of which of the input terminals of the 4-to-1 multiplexers 1220 to 1223 are to be selected, and the output terminals of the 4-to-1 multiplexers 1220 to 1223 may output respective portions of the second data to the second buffer 13 addressed by output location pointers P0 to P3. Each of the input location pointers L0 to L3 and the output location pointers P0 to P3 may point to a piece of 2-byte data, and may be managed by the address converter 120. The 4-to-1 multiplexers 1220 to 1223 may retrieve 8-byte data addressed by the input location pointers L0 to L3. In some embodiments, the selection signals M0<1:0> to M3<1:0> may select 4 pieces of 2-byte data to produce 4 pieces of 2-byte data to be sent according to the output location pointers P0 to P3, respectively. In other embodiments, the selection signals M0<1:0> to M3<1:0> may select a portion of the 4 pieces of 2-byte data and unselect the remains of the 4 pieces of 2-byte data, so as to produce less-than-8-byte data to be sent according to a corresponding portion of the output location pointers P0 to P3. For example, if 2 pieces of data corresponding to the input location pointers L2 and L3 are identified as invalid data read from bad columns, the selection signals M0<1:0> to M3<1:0> may select 2 pieces of data corresponding to the input location pointers L0 and L1 and unselect the 2 pieces of data corresponding to the input location pointers L2 and L3 so as to produce 2 pieces of data to be sent corresponding to the output location pointers P0 and P1.

Table 1 shows 4 cases of input location pointers prior to the data mapping, Table 2 shows 4 corresponding cases of input location pointers after the data mapping, where Ln, NLn and NNLn respectively represent input location pointers pointing to data in the present clock cycle, the next clock cycle, and 2 clock cycles from the present one, n is an integer ranging between 0 and 3, and the quoted alphanumerics represent input location pointers pointing to invalid data pieces. The data mapping may be performed by the address converter 120 to convert the input location pointers in Table 1 into the input location pointers in Table 2. The input location pointers refer to 4 data pieces to be received by the 4-to-1 multiplexers 1220 to 1223, respectively.

TABLE 1

| Case 1 | "L2" | L3   | NL0   | NL1   |
|--------|------|------|-------|-------|
| Case 2 | "L2" | "L3" | NL0   | NL1   |
| Case 3 | "L2" | "L3" | "NL0" | NL1   |
| Case 4 | "L2" | "L3" | "NL0" | "NL1" |

TABLE 2

| Case 1 | L3  | NL0 | NL1  | NL2  |
|--------|-----|-----|------|------|
| Case 2 | NL0 | NL1 | NL2  | NL3  |
| Case 3 | NL1 | NL2 | NL3  | NNL0 |
| Case 4 | NL2 | NL3 | NNL0 | NNL1 |

In Case 1, initially in Table 1, the input location pointer L2 points to an invalid data piece and the input location pointers L3, NL0, NL1 point to valid data pieces. In Table 2, the address converter 120 may identify the invalid data piece using the bad column table 180, discard the input location pointer L2 and bring forward the input location pointers L3, NL0, NL1, and a subsequent input location pointer NL2. In Case 2 of Table 1, the input location pointers L2, L3 point to invalid data pieces and the input location pointers NL0, NL1 point to valid data pieces. In Table 2, the address converter 120 may drop the input location pointers L2, L3 and bring forward the input location pointers NL0, NL1 and subsequent input location pointers NL2, NL3. In Case 3 of Table 1, the input location pointers L2, L3, NL0 point to invalid data pieces and the input location pointer NL1 points to a valid data piece. In Table 2, the address converter 120 may remove the input location pointers L2, L3, NL0 and move forward the input location pointer NL1 and subsequent input location pointers NL2, NL3, NNL0. In Case 4 of Table 1, the input location pointers L2, L3, NL0, NL1 all point to invalid data pieces. In Table 2, the address converter 120 may remove the input location pointers L2, L3, NL0, NL1 and move forward subsequent input location pointers NL2, NL3, NNL0, NNL1. In this fashion, the address converter 120 may control the input location pointers of the 4-to-1 multiplexers 1220 to 1223.

Figure 5:
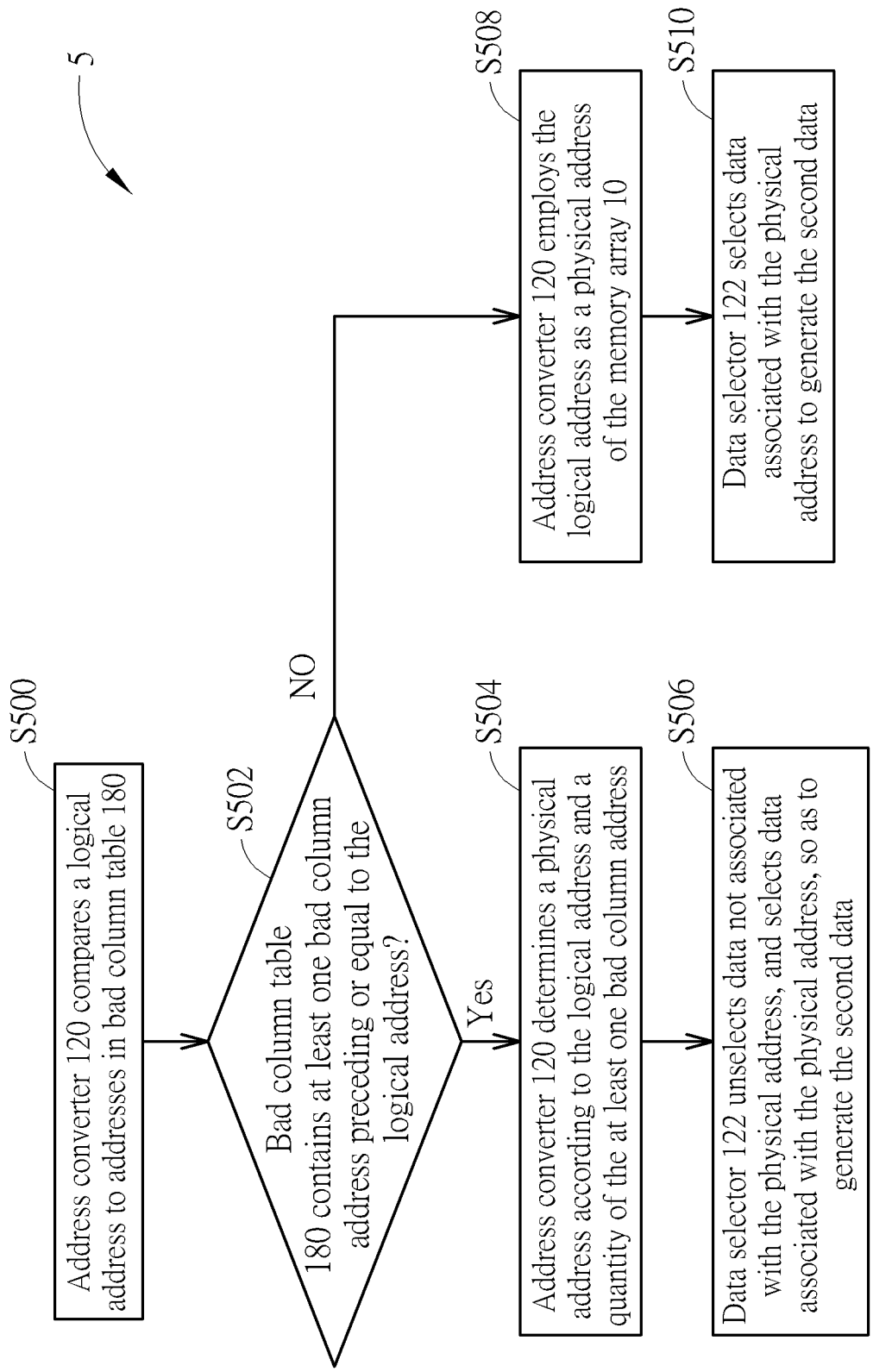
FIG. 5 is a flowchart of a method of controlling the repair logic circuit in FIG. 4.

FIG. 5 is a flowchart of a method 5 of controlling the repair logic circuit 12 in FIG. 4. The method 5 comprises Steps S500 to S510. Steps S500 to S504, S508 are used to translate the logical address into the physical address of the memory array 10 according to the bad column addresses, so as to generate the selection signals M0<1:0> to M3<1:0> for the 4-to-1 multiplexers 1220 to 1223. Steps S506 and S510 are used to select or unselect data pieces from the first data in accordance with the selection signals M0<1:0> to M3<1:0>, so as to generate the second data. Any reasonable technological change or step adjustment is within the scope of the disclosure. Steps S500 to S510 are provided as follows:

Step S500: Address converter 120 compares a logical address to bad column addresses in bad column table 180;

Step S502: Address converter 120 determines whether bad column table 180 contains at least one bad column address preceding or equal to the logical address? If so, go to Step S504, and if not, go to Step S508;

Step S504: Address converter 120 determines a physical address according to the logical address and a quantity of the at least one bad column address;

Step S506: Data selector 122 unselects data not associated with the physical address, and selects data associated with the physical address, so as to generate the second data.

Step S508: Address converter 120 employs the logical address as a physical address of the memory array 10;

Step S510: Data selector 122 selects data associated with the physical address to generate the second data.

Upon startup, the memory device 1 receives a read command carrying a logical address of data to be read. The address converter 120 acquires the logical address and the bad column table 180, and compares the logical address to bad column addresses in bad column table 180 (S500), so as to determine whether the bad column table 180 contains at least one bad column address preceding or equal to the logical address (S502). If so, data should be read from a physical address different from the logical address on account of the bad columns, and the address converter 120 determines the physical address according to the logical address and a quantity of the at least one bad column address (S504). In some embodiments, the address converter 120 pushes back the logical address by 2 bytes for each of the bad column addresses preceding or equal to the logical address to derive the physical address. For example, if there are 3 bad column addresses preceding or equal to the logical address, the address converter 120 increments the logical address by 6 bytes to derive the physical address. In some embodiments, the address converter 120 generates the selection signals M0<1:0> to M3<1:0> to select data matching the physical address and unselect data not matching the physical address. Next, the data selector 122 unselects, according to the selection signals M0<1:0> to M3<1:0>, data not associated with the physical address, and selects, according to the selection signals M0<1:0> to M3<1:0>, data associated with the physical address, so as to generate the second data (S506).

If the bad column table 180 contains no bad column address preceding or equal to the logical address, data should be read from the logical address, and the address converter 120 employs the logical address as the physical address of the memory array 10 (S508). The address converter 120 generates the selection signals M0<1:0> to M3<1:0> to select data matching the physical address, and the data selector 122 selects, according to the selection signals M0<1:0> to M3<1:0>, the data associated with the physical address, so as to generate the second data (S510).

Figure 6:
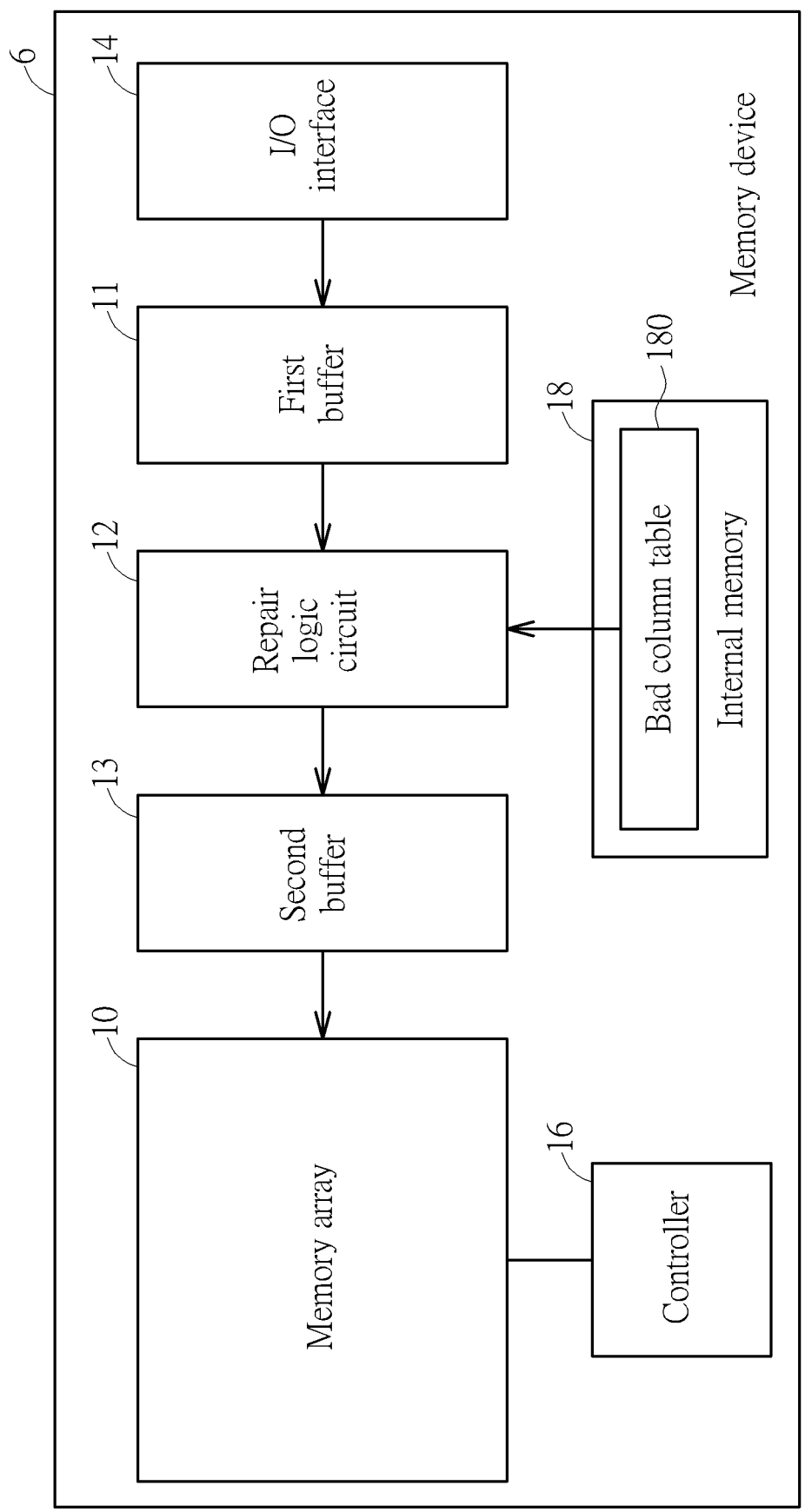
FIG. 6 is a block diagram of a memory device according to another embodiment of the invention.

FIG. 6 is a block diagram of a memory device 6 according to an embodiment of the invention. The memory device 6 is similar to the memory device 1 except that data may be written thereto by skipping bad columns and writing data next thereto. The memory device 6 may reuse the first buffer 11, the repair logic circuit 12 and the third buffer 13 of the memory device 1 to perform a writing operation. The I/O interface 14 is coupled to the first buffer 11, and the second buffer 13 is coupled to the memory array 10. A data flow of the writing operation is in reverse order of that of the reading operation. The I/O interface 14 may receive a writing command carrying first data and a logical address where the first data is to be written. Explanations for operations of the memory array 10, the I/O interface 14, the controller 16 and the internal memory 18 are identical to those in memory device 1 and will be omitted for brevity. Explanations for operations of the first buffer 11, the repair logic circuit 12 and the third buffer 13 in a writing operation will be detailed as follows.

In the writing operation, the first buffer 11 may receive the first data from the I/O interface 14. The repair logic circuit 12 may receive the bad column table 180 from the internal memory 18, receive the first data from the first buffer 11, map the first data onto the second data according to the bad column table 180, and transmit the second data to the second buffer 13. The second buffer 13 may transmit the second data to the memory array 10 for writing the same. The repair logic circuit 12 may perform data mapping by retrieving the logical address from the writing command, mapping the logical address onto a physical address of the memory array 10 according to the bad column table 180, and inserting invalid data into the first data in accordance with the locations of the bad columns, so as to generate the second data.

Specifically, in the writing operation, the first buffer 11 may receive the first data from the I/O interface 14 according to the third clock at a third speed. The repair logic circuit 12 may receive the first data from the first buffer 11 according to the first clock at the first speed equivalent to a quarter of the third speed, convert the first data into the second data and adjust a speed of transmitting the second data to the second buffer 13 on the basis of presence of the bad columns, thereby writing the first data at a fixed speed regardless of the first data being associated with good columns or not.

When the bad column table 180 indicates that the first data is associated with the bad columns, the repair logic circuit 12 may convert the first data into the second data and transmitting the second data to the second buffer 13 at a speed exceeding the first speed, e.g., twice the first speed; whereas when the bad column table 180 indicates that the first data is not associated with the bad column in the memory array 10, the repair logic circuit 12 may forward the first data as the second data to the second buffer 13 according to the first clock at the first speed. In this fashion, the speed of writing the first data into the memory array 10 may be greater than or equal to the first speed even if a portion of the first data, e.g., half of the first data, is associated with the bad columns. In the case of writing the first data at twice the first speed, the memory device 6 may write the first data into a memory space with one half thereof being bad columns without data loss. The second buffer 13 may transmit the second data to the memory array 10 according to the first clock at the first speed, thereby completing the writing operation.

The memory device 6 adopts the first buffer 11, the repair logic circuit 12 and the second buffer 13 to manage bad columns and enhance circuit performance during a writing operation.

Figure 7:
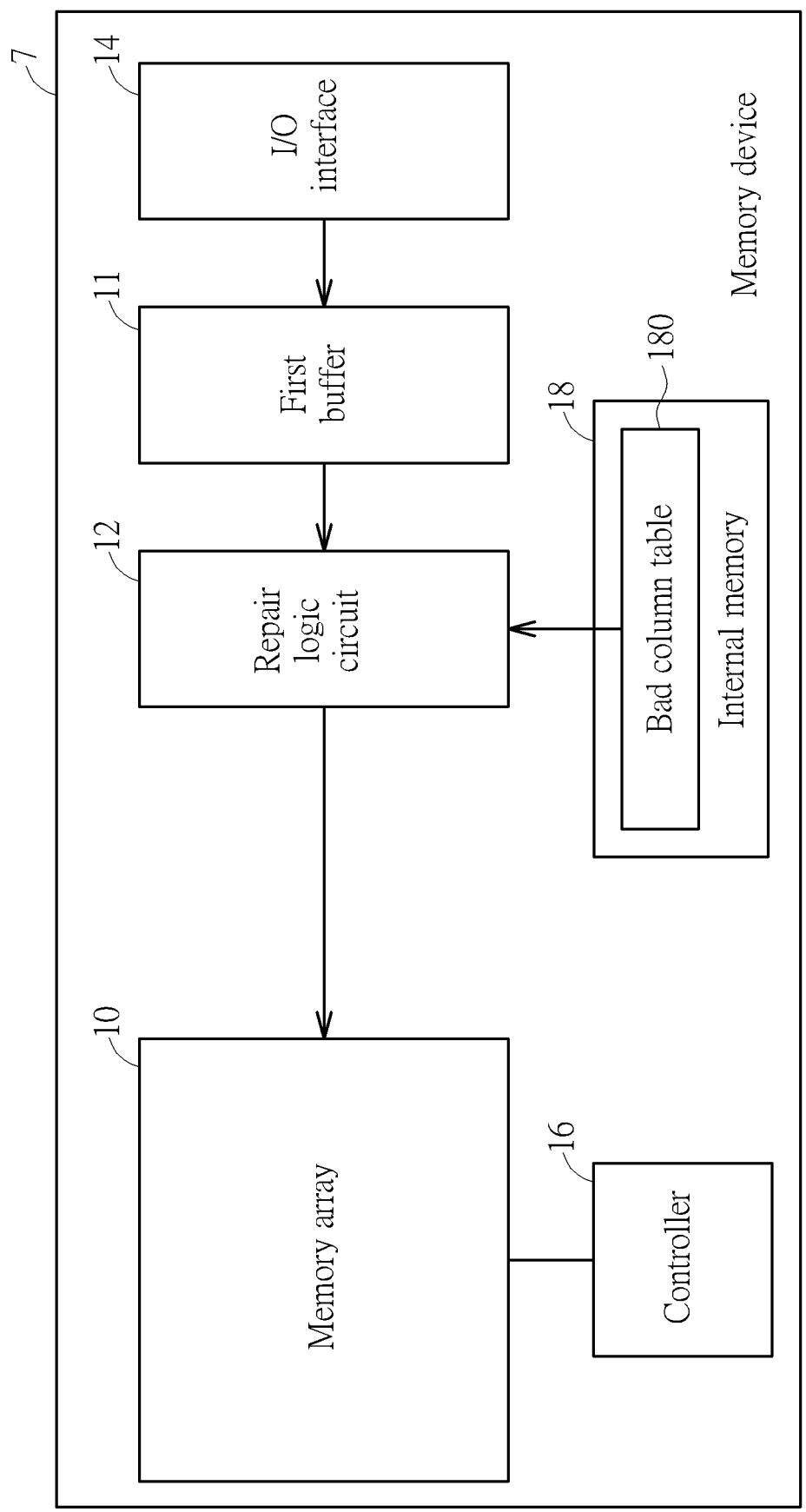
FIG. 7 is a block diagram of a memory device according to yet another embodiment of the invention.

FIG. 7 is a block diagram of a memory device 7 according to yet another embodiment of the invention. The memory device 7 may manage bad columns of the memory array 10 and write data thereto by skipping the bad columns, and is similar to the memory device 6 except that the second buffer 13 is omitted. The repair logic circuit 12 is coupled to the memory array 10, and may perform the data mapping on the first data to generate the second data according to the first clock at the first speed. In turn, the memory array 10 may write the second data at the first speed. The memory device 7 adopts the first buffer 11 and the repair logic circuit 12 to manage bad columns and enhance circuit performance during a writing operation.

Figure 8:
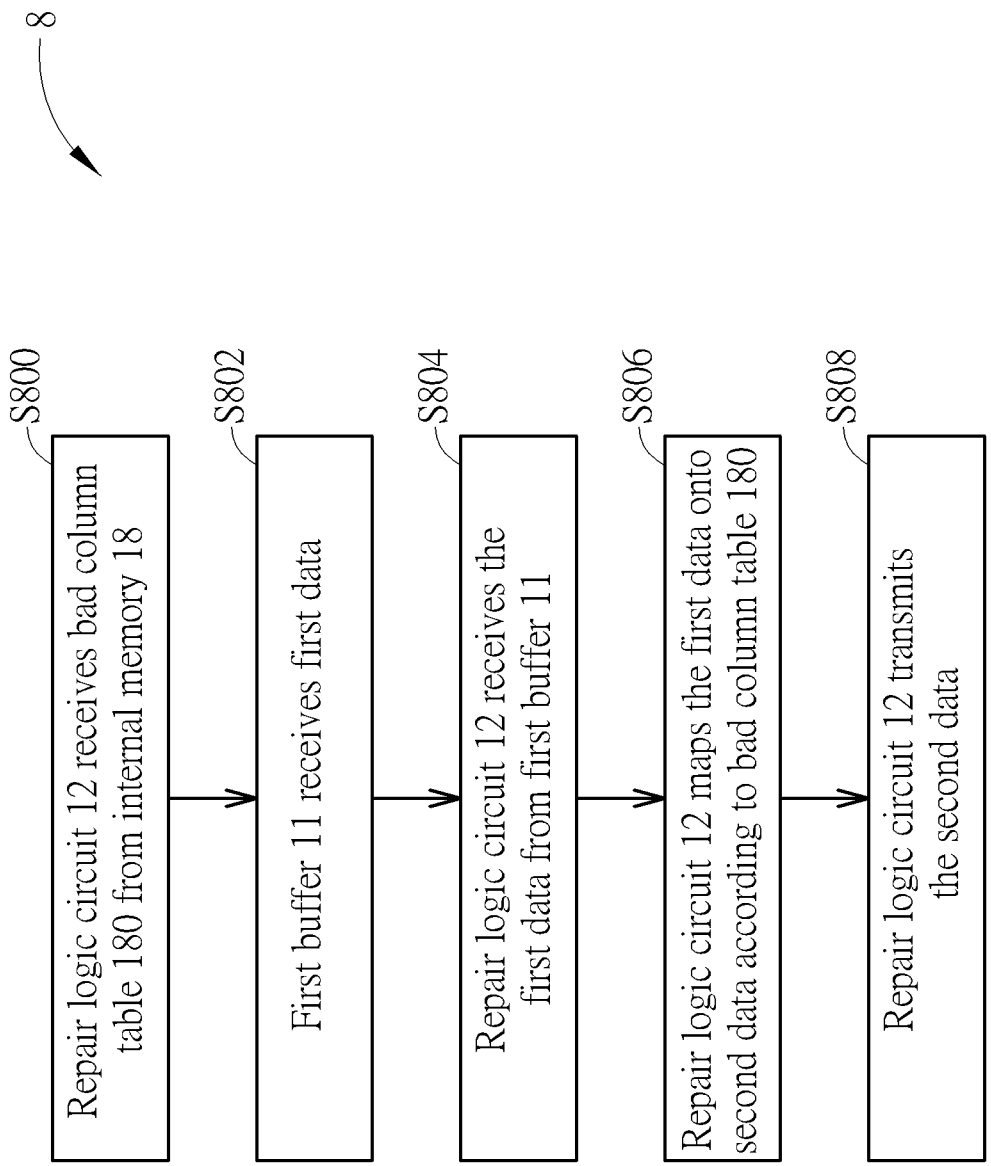
FIG. 8 is a flowchart of a method of controlling the memory device in FIG. 1, 6 or 7.

FIG. 8 is a flowchart of a method 8 of controlling the memory device 1, 6 or 7. The method 8 comprises Steps S800 to S808 used to map the first data onto the second data, so as to read from or write into the memory device 1, 6 or 7 having bad columns. Any reasonable technological change or step adjustment is within the scope of the disclosure. Steps S800 to S808 are provided as follows:

Step S800: Repair logic circuit 12 receives bad column table 180 from internal memory 18;
Step S802: First buffer 11 receives first data;
Step S804: Repair logic circuit 12 receives the first data from first buffer 11;
Step S806: Repair logic circuit 12 maps the first data onto second data according to bad column table 180;
Step S808: Repair logic circuit 12 transmits the second data.

Steps S800 to S808 are explained in detail in the preceding paragraphs, and explanation therefor is omitted for brevity. The method 8 may be adopted by the memory device 1, 6 or 7 to manage bad columns and deliver efficient memory operations.

The memory devices 1, 6 and 7 and the methods 5 and 8 employ the first buffer 11, the repair logic circuit 12 and the second buffer 13 to manage bad columns without the use of redundancy columns, enhancing circuit area efficiency while providing reliable memory operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating a memory device, the memory device comprising a memory array, a first buffer, a second buffer, a repair logic circuit and an internal memory, and the method comprising:
   the repair logic circuit receiving a bad column table from the internal memory, the bad column table containing information of a bad column in the memory array;
   the first buffer receiving first data;
   the repair logic circuit receiving the first data from the first buffer; and
   the repair logic circuit mapping the first data onto second data according to the bad column table.

2. The method of claim 1, wherein:
   the bad column table contains a bad column address of the bad column in the memory array; and
   the repair logic circuit mapping the first data onto the second data according to the bad column table comprises:
      the repair logic circuit mapping a logical address onto a physical address of the memory array according to the bad column table; and
      the repair logic circuit unselecting, from the first data, data not associated with the physical address to generate the second data.

3. The method of claim 2, wherein the repair logic circuit mapping the logical address onto the physical address of the memory array according to the bad column table comprises:
the repair logic circuit determining whether the bad column table contains at least one bad column address preceding or equal to the logical address; and
if so, the repair logic circuit determining the physical address according to the logical address and a quantity of the at least one bad column address.

4. The method of claim 1, wherein the repair logic circuit mapping the first data onto the second data according to the bad column table comprises:
the repair logic circuit mapping the first data onto the second data during a pre-fetch period.

5. The method of claim 1, further comprising:
in a reading operation, the first buffer receiving the first data from the memory array at a first speed,
wherein the repair logic circuit receiving the first data from the first buffer comprises:
in the reading operation, the repair logic circuit receiving the first data from the first buffer at twice the first speed when the bad column table indicates that the first data is associated with the bad column in the memory array.

6. The method of claim 1, further comprising:
in a reading operation, the first buffer receiving the first data from the memory array at a first speed,
wherein the repair logic circuit receiving the first data from the first buffer comprises:
in the reading operation, the repair logic circuit receiving the first data from the first buffer at the first speed when the bad column table indicates that the first data is not associated with the bad column in the memory array.

7. The method of claim 1, further comprising:
in a reading operation, the repair logic circuit transmitting the second data to the second buffer at a first speed; and
in the reading operation, the second buffer transmitting the second data to an input/output interface of the memory device at four times of the first speed.

8. The method of claim 1, wherein:
the repair logic circuit receiving the first data from the first buffer comprises:
in a writing operation, the repair logic circuit receiving the first data from the first buffer at a first speed;
the method further comprises:
in the writing operation, the repair logic circuit inserting invalid data into the first data to generate the second data when the bad column table indicates that the first data is associated with the bad column in the memory array; and
in the writing operation, the repair logic circuit transmitting the second data to the second buffer at twice the first speed when the bad column table indicates that the first data is associated with the bad column in the memory array.

9. The memory device of claim 1, wherein:
the repair logic circuit receiving the first data from the first buffer comprises:
in a writing operation, the repair logic circuit receiving the first data from the first buffer at a first speed; and
in the writing operation, the repair logic circuit transmitting the second data to the second buffer at the first speed when the bad column table indicates that the first data is not associated with the bad column in the memory array.

10. The method of claim 1, further comprising:
the repair logic circuit transmitting the second data to the memory array.

11. A memory device comprising:
a first buffer, configured to receive first data;
a second buffer, configured to receive second data;
a memory array, coupled to one of the first buffer and the second buffer, and comprising an array of memory cells;
an internal memory, configured to store a bad column table containing information of a bad column of the memory array; and
a repair logic circuit, coupled to the internal memory and between the first buffer and the second buffer, and configured to receive the first data from the first buffer, map the first data onto second data according to the bad column table, and transmit the second data to the second buffer.

12. The memory device of claim 11, wherein:
the bad column table contains a bad column address of the bad column in the memory array;
the repair logic circuit comprises an address converter and a data selector coupled thereto;
the address converter is configured to map a logical address onto a physical address of the memory array according to the bad column table; and
the data selector is configured to unselect, from the first data, data not associated with the physical address to generate the second data.

13. The memory device of claim 12, wherein:
the repair logic circuit is configured to determine whether the bad column table contains at least one bad column address preceding or equal to the logical address, and if so, determine the physical address according to the logical address and a quantity of the at least one bad column address.

14. The memory device of claim 11, wherein the repair logic circuit is configured to map the first data onto the second data during a pre-fetch period.

15. The memory device of claim 11, wherein:
in a reading operation, the first buffer is configured to receive the first data from the memory array at a first speed; and
when the bad column table indicates that the first data is associated with the bad column in the memory array, the repair logic circuit is configured to receive the first data from the first buffer at twice the first speed.

16. The memory device of claim 11, wherein:
in a reading operation, the first buffer is configured to receive the first data from the memory array at a first speed,
when the bad column table indicates that the first data is not associated with the bad column in the memory array, the repair logic circuit is configured to receive the first data from the first buffer at the first speed.

17. The memory device of claim 11, wherein:
the repair logic circuit is configured to transmit the second data to the second buffer at a first speed; and
in a reading operation, the second buffer is configured to transmit the second data at four times of the first speed.

18. The memory device of claim 11, wherein:
in a writing operation, the repair logic circuit is configured to receive the first data from the first buffer at a first speed, and when the bad column table indicates that the first data is associated with the bad column in the memory array, insert invalid data into the first data to generate the second data, and transmit the second data to the second buffer at twice the first speed.

19. The memory device of claim 11, wherein:

in a writing operation, the repair logic circuit is configured to receive the first data from the first buffer at a first speed, and when the bad column table indicates that the first data is associated with the bad column in the memory array, transmit the second data to the second buffer at the first speed.

20. A memory device comprising:

a first buffer, configured to receive first data;

a memory array, comprising an array of memory cells;

an internal memory, configured to store a bad column table containing information of a bad column of the memory array; and a repair logic circuit, coupled to the internal memory and between the first buffer and the memory array, and configured to receive the first data from the first buffer, map the first data to second data according to the bad column table, and transmit the second data to the memory array.

* * * * *